(12) United States Patent
Nguyen et al.

(10) Patent No.: US 6,650,155 B1
(45) Date of Patent: Nov. 18, 2003

(54) POWER-ON RESET CIRCUIT

(75) Inventors: Toan D. Nguyen, Plymouth, MN (US); Matthew J. Russell, Burnsville, MN (US)

(73) Assignee: LSI Logic Corporation, Milipitas, CA (US)

( * ) Notice: Subject to any disclaimer, the term of this patent is extended or adjusted under 35 U.S.C. 154(b) by 0 days.

(21) Appl. No.: 10/213,761

(22) Filed: Aug. 7, 2002

(51) Int. Cl.[7] .................................................. H03L 7/00
(52) U.S. Cl. ....................................... 327/143; 327/198
(58) Field of Search ................................. 327/143, 198

(56) References Cited

U.S. PATENT DOCUMENTS

| | | | |
|---|---|---|---|
| 4,634,904 A | 1/1987 | Wong | 307/594 |
| 4,983,857 A | 1/1991 | Steele | 307/272.3 |
| 5,959,476 A | * 9/1999 | Pascucci | 327/143 |
| 6,329,851 B1 | 12/2001 | Murphy | 327/143 |
| 6,329,852 B1 | 12/2001 | Seo | 327/143 |
| 6,353,355 B2 | * 3/2002 | Kato | 327/535 |
| 6,483,357 B2 | * 11/2002 | Kato et al. | 327/143 |

* cited by examiner

*Primary Examiner*—Terry D. Cunningham
*Assistant Examiner*—Quan Tra
(74) *Attorney, Agent, or Firm*—Westman, Champlain & Kelly

(57) ABSTRACT

A power-on reset circuit is provided, which includes a ground input, a power input having a voltage relative to the ground input, a reset output, a self-initializing latch, a high voltage trigger circuit and a discharge circuit. The self-initializing latch has first and second latch nodes which are initialized to logic high and low states, respectively, upon initial application of power to the power input. One of the first and second latch nodes is coupled to the reset output. The high voltage trigger circuit is coupled to the first latch node and reverses the states of the first and second latch nodes when the voltage rises above a high trigger voltage. The discharge circuit is coupled to the second latch node and has a switch circuit, which selectively couples the second latch node to the ground input when the voltage falls below a low trigger voltage.

18 Claims, 3 Drawing Sheets

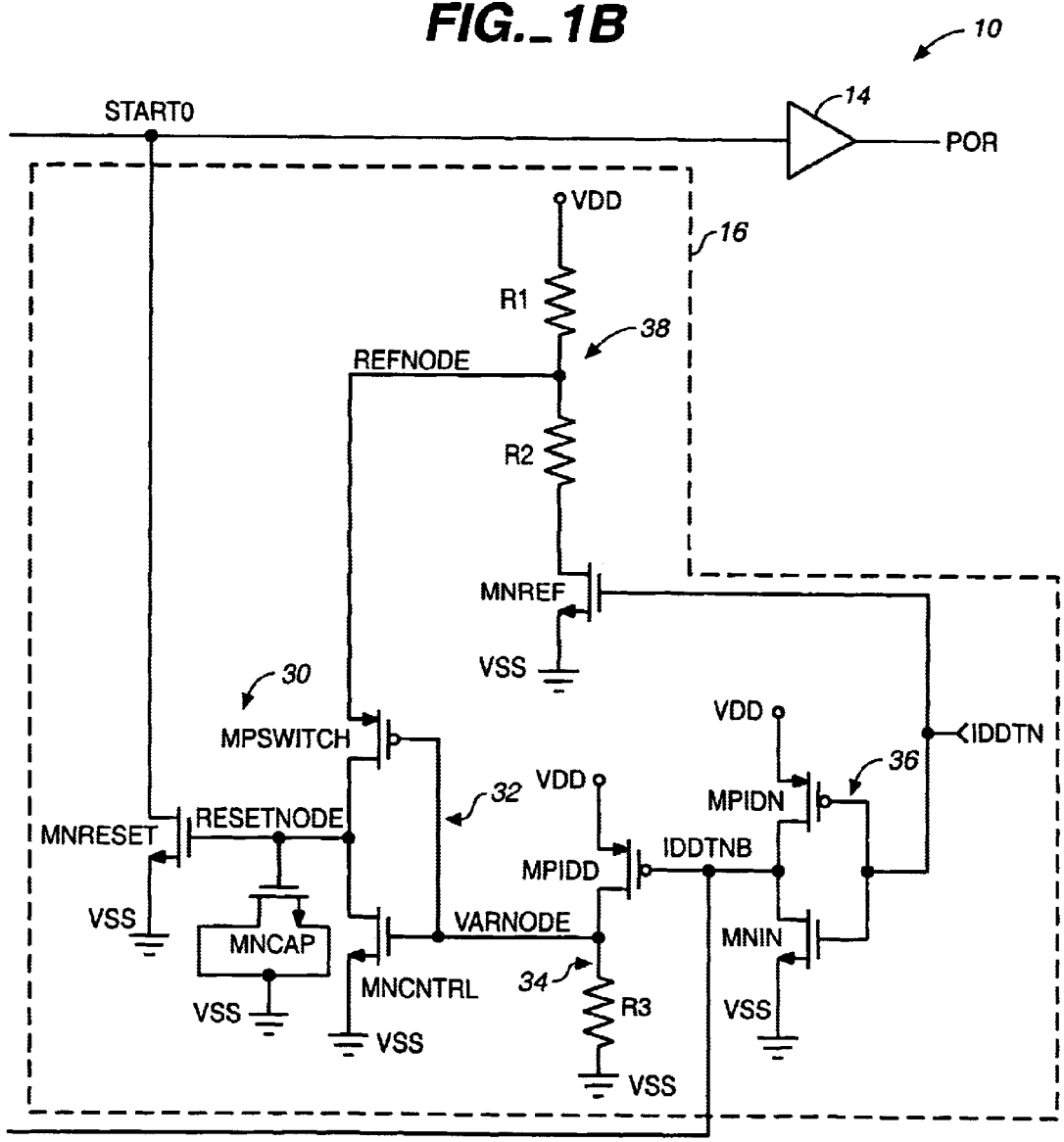
FIG._1
FIG._1B

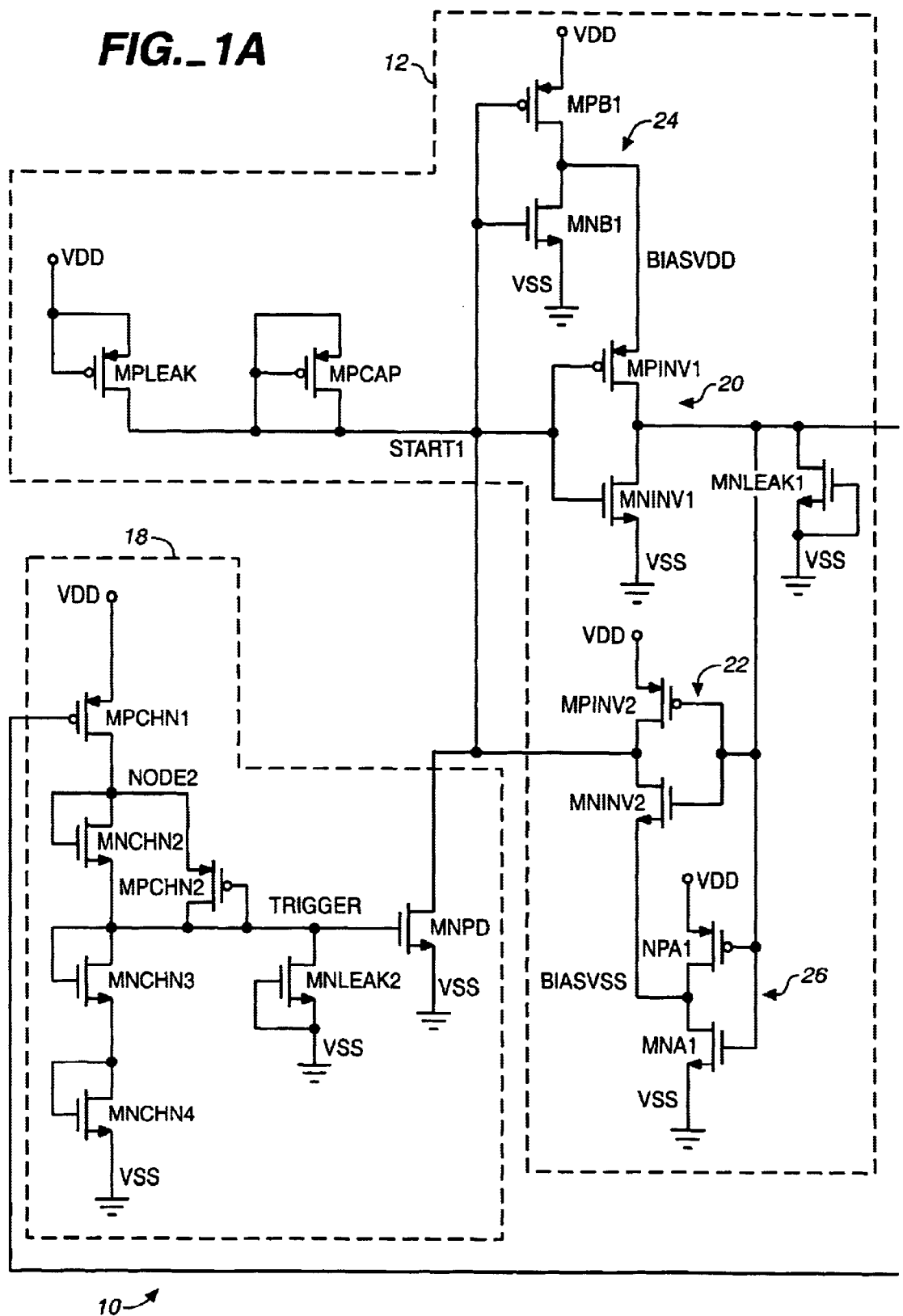
FIG._1A

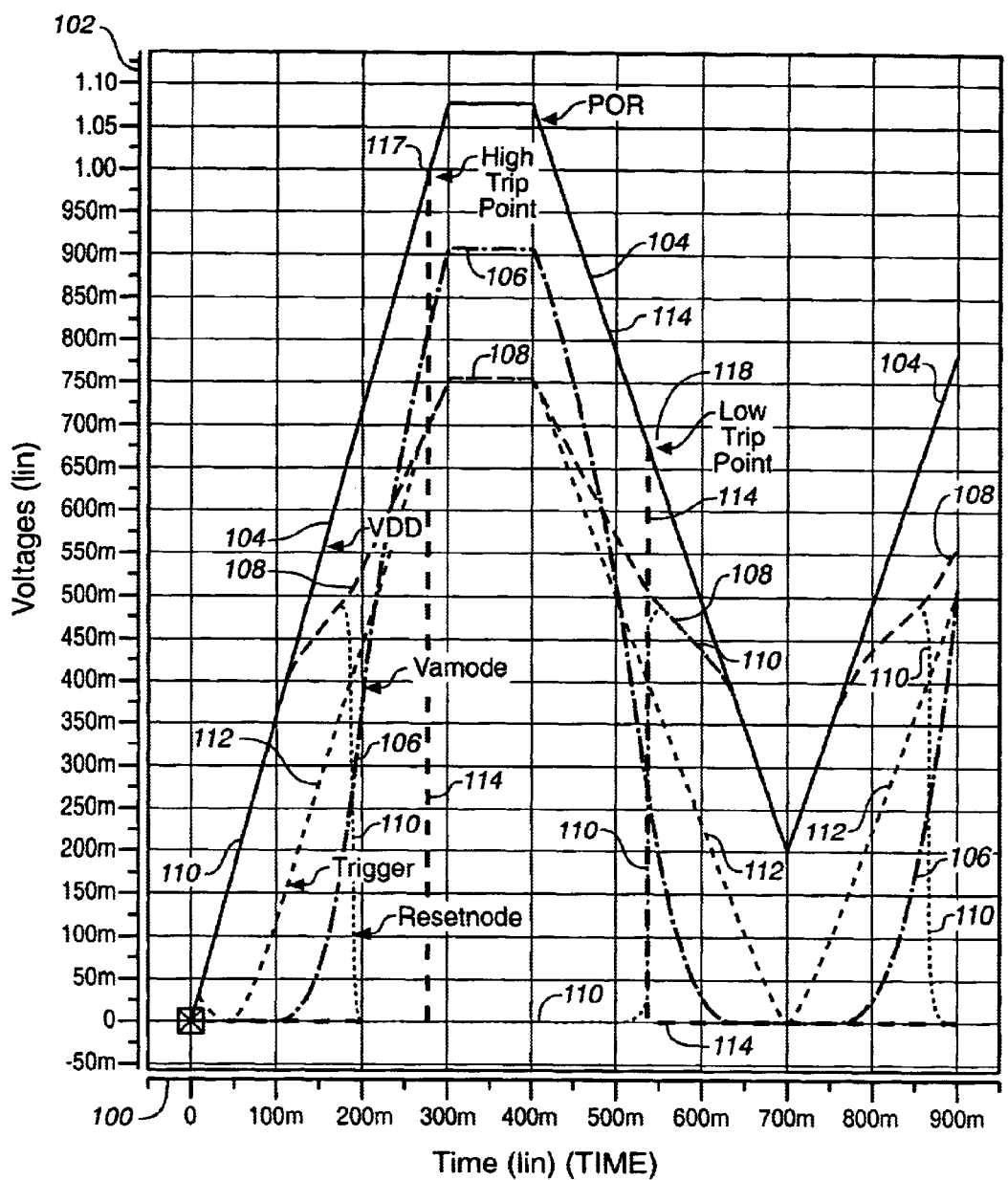
FIG._2

POWER-ON RESET CIRCUIT

FIELD OF THE INVENTION

The present invention relates to semiconductor integrated circuits and more particularly, to a circuit that generates a reset signal for the integrated circuit at the time of power-on and after abrupt changes in the power supply voltage.

BACKGROUND OF THE INVENTION

The initial application of a power supply voltage to a semiconductor integrated circuit is referred to as "power-up". When powering-up an integrated circuit, the power supply voltage is often ramped-up to the intended operating voltage range over a small ramp time instead of directly applying the full operating voltage. Usually, the power supply voltage ramp time is in the order of microseconds to milliseconds.

During this initial power-up sequence, the semiconductor devices within the integrated circuit can enter uncertain logic states, which can adversely affect subsequent device operation. For example, in digital circuits, as the power supply voltage ramps-up, some semiconductor devices may suffer sub-threshold leakage current such that their output nodes enter intermediate voltage levels. These nodes can be driven to random logic states or incorrect logic states once the power supply voltage reaches its full operating voltage. As a result, the voltages at the various nodes within the integrated circuit may be unpredictable after power-up. Such a power-up sequence is undesirable since proper operation of the circuit cannot be ensured.

Typical integrated circuit devices therefore have some type of power-on reset (POR) for resetting internal devices or circuits upon power-up. During or shortly after power-up, a POR signal is generated and propagated through the integrated circuit to drive selected nodes to predetermined logic levels. For example, these nodes can be used for resetting sequential devices such as flip-flops, clock circuits and memory devices. Once these nodes are initialized, then proper operation of the integrated circuit can begin.

A similar concern is raised by devices having power-saving modes in which the power supply is powered-down or portions of the devices are disconnected from the supply voltage. During power-down, as the supply voltage drops toward zero volts, some of the circuits or nodes in these devices may not discharge completely to zero volts along with the supply voltage. This discharge problem gets worse if the power supply voltage drops more quickly due to system glitches resulting from noise. In these situations, the power supply voltage can drop much faster than the internal circuits of the device are able to discharge. When the power supply voltage ramps up again, latent voltage that was unable to discharge completely during power-down on the previous cycle can cause the POR signal to be re-generated before the power supply has reached a predetermined level.

U.S. Pat. No. 4,983,857 describes a power-on reset circuit having two Field Effect Transistors (FETs) connected in a diode stack arrangement between the power supply and the input to an inverter. Another FET is connected between the input to the inverter and a ground node. A capacitor is also connected between the input to the inverter and the ground node. As the power supply rises above the sum of the threshold voltages of the FETs in the diode stack, current starts flowing through the diode stack to charge the capacitor and drive the inverter. The inverter output is used as a power-on reset signal. This circuit has a couple disadvantages. First, there is a DC current path between the voltage input and the ground node, which unnecessarily dissipates power within the power-on reset circuit after it has generated the reset signal. Second, the circuit does not have the ability to discharge quickly during power cycling or a during a power savings mode. Power cycling is caused by the power supply turning on and off due to noise or system events. When the power supply voltage starts to decrease it takes a long time to discharge the voltage across the capacitor to zero volts. This delay can cause the device with which the power-on reset circuit is used to malfunction.

U.S. Pat. No. 6,329,852 discloses a power-on reset circuit having two FETs connected in a diode stack arrangement and is capable of generating a reset signal regardless of the ramp-up time of the power supply. However, this circuit also has in internal capacitor with no method of discharging the capacitor quickly when the power supply is powered down.

U.S. Pat. No. 6,329,851 discloses a power-on reset cell having a discharge circuit that is capable of discharging a subcircuit of the power-on reset cell when the supply voltage ramps down. This circuit also uses an internal capacitor. When the supply voltage slowly decreases, such as over a millisecond range, the circuit requires a large capacitor, which in turn consumes a relatively large amount of area on the integrated circuit.

Further improved power-on reset circuits are desired.

SUMMARY OF THE INVENTION

One embodiment of the present invention is directed to a power-on reset circuit, which includes a ground input, a power input having a voltage relative to the ground input, a reset output, a self-initializing latch, a high voltage trigger circuit and a discharge circuit. The self-initializing latch has first and second latch nodes which are initialized to logic high and low states, respectively, upon initial application of power to the power input. One of the first and second latch nodes is coupled to the reset output. The high voltage trigger circuit is coupled to the first latch node and reverses the states of the first and second latch nodes when the voltage rises above a high trigger voltage. The discharge circuit is coupled to the second latch node and has a switch circuit, which selectively couples the second latch node to the ground input when the voltage falls below a low trigger voltage. The switch circuit is controlled by first and second switch control nodes that follow the voltage. The first switch control node has a greater rate of change than the second switch control node.

BRIEF DESCRIPTION OF THE DRAWINGS

FIG. 1 is a schematic diagram illustrating a power-on reset circuit according to one embodiment of the present invention.

FIG. 2 is a waveform diagram illustrating a power-on reset output and internal nodes of the circuit shown in FIG. 1 over time.

DETAILED DESCRIPTION OF ILLUSTRATIVE EMBODIMENTS

FIG. 1 is a schematic diagram of a power-on reset (POR) circuit 10 according to one embodiment of the present invention. Power-on reset circuit 10 includes latch circuit 12, buffer 14, discharge circuit 16 and high voltage trigger circuit 18. Latch circuit 12 includes P-channel transistors MPLEAK, MPCAP, MPINV1, MPINV2, MPB1 AND MPA1 AND N-channel transistors MNINV1, MNINV2, MNB1, MNA1 AND MNLEAK. Latch circuit 12 further includes latch nodes START1 and START0.

Transistors MPINV1 and MNINV1 are coupled together to form an inverter 20 having an input coupled to latch node START1 and an output coupled to latch node START0. Transistor MPINV1 has a gate coupled to START1, a drain coupled to START0 and a source coupled to high voltage bias node BIASVDD. Transistor MNINV1 has a gate coupled to latch node START1, a drain coupled to latch node START0 and a source coupled to ground supply terminal VSS.

Transistors MPINV2 and MNINV2 are coupled to form an inverter 22 having an input coupled to latch node START0 and an output coupled to latch node START1. Transistor MPINV2 has a gate coupled to latch node START0, a drain coupled to latch node START1 and a source coupled to voltage supply terminal VDD. Transistor MNINV2 has a gate coupled to latch node START0, a drain coupled to latch node START1 and a source coupled to low voltage bias node BIASVSS. Inverters 20 and 22 are coupled in a back-to-back configuration to form a latch, wherein latch nodes START1 and START0 have opposite logic states.

P-channel transistor MPCAP is coupled as a drain capacitor on latch node START1. Transistor MPCAP has a gate, drain and source coupled to latch node START1. P-channel transistor MPLEAK and N-channel transistor MNLEAK1 are pull-up and pull-down leakage transistors that provide leakage current paths to VDD and VSS, respectfully, to set up an initial state of the latch. Transistor MPLEAK has a gate and source coupled to VDD and a drain coupled to latch node START1. Transistor MNLEAK1 has a gate and source coupled to VSS and a drain coupled to latch node START0.

When power-on reset circuit 10 is initially powered-up, the voltage on VDD is slowly raised up from a low voltage, such as 0 volts, toward a steady-state high voltage, such as 1.2 or 1.8 volts. Other supply voltage levels can also be used in alternative embodiments of the present invention. As the voltage on VDD is slowly raised up, latch node START1 quickly attains a logic high voltage due to the leakage current through transistor MPLEAK, and node START0 quickly attains a logic low voltage due to leakage through transistor MNLEAK1. The latch formed by inverters 20 and 22 is therefor self-initializing.

Other circuits and devices can be used to initialize the latch in alternative embodiments of the present invention. For example, resistors and/or diodes can be used to bias the latch into an initial state.

Inverters 24 and 26 are provided in one embodiment of the present invention to reduce leakage current paths through transistors MPINV1 and MNINV2 when these transistors are off. Inverter 24 has an input coupled to START1 and an output coupled to BIASVDD. Inverter 24 is formed by P-channel transistor MPB1 and N-channel transistor MNB1. Transistor MPB1 has a gate coupled to latch node START1, a drain coupled to high voltage bias node BIASVDD and a source coupled to VDD. Transistor MNB1 has a gate coupled to latch node START1, a drain coupled to high voltage bias node BIASVDD and a source coupled to VSS. When latch node START1 is high and transistor MPINV1 is off, inverter 24 pulls BIASVDD low to reduce leakage current through transistor MPINV1.

Similarly, inverter 26 has an input coupled to START0 and an output coupled to BIASVSS. Inverter 26 is formed by P-channel transistor MPA1 and N-channel transistor MNA1. Transistor MPA1 has a gate coupled to START0, a drain coupled to BIASVSS and a source coupled to VDD. Transistor MNA1 has a gate coupled to START0, a drain coupled to BIASVSS and a source coupled to VSS. When START0 is low, transistor MNINV2 is off, and inverter 26 pulls BIASVSS high to reduce leakage current through transistor MNINV2.

Discharge circuit 16 provides the ability to quickly discharge latch node START0 when the voltage on VDD drops below a predetermined low trigger voltage and also ensures that START0 remains low during initial start-up. Discharge circuit 16 includes P-channel transistors MPSWITCH, MPIDD and MPIDN, N-channel transistors MNRESET, MNCNTRL, MNREF, MNIN, and MNCAP and resistor R1, R2 and R3.

Transistor MNRESET, MPSWITCH and MNCNTRL form a switch circuit 30, which selectively couples latch node START0 to VSS at the initial start-up of power-on reset circuit 10 and when the voltage on VDD falls below the low trigger voltage. Reset transistor MNRESET has a gate coupled to reset node RESETNODE, a drain coupled to latch node START0 and a source coupled to VSS. Transistors MPSWITCH and MNCNTRL are coupled together form a switch control inverter 32. Transistor MPSWITCH has a gate coupled to variable node VARNODE, a drain coupled to reset node RESETNODE and a source coupled to reference node REFNODE. Transistor MNCNTRL has a gate coupled to variable node VARNODE, a drain couple to RESETNODE and a source coupled to VSS. As described in more detail below, VARNODE and REFNODE form switch control inputs for switch 30 that follow the voltage on VDD non-linearly and linearly respectively. VARNODE has a greater rate-of-change than REFNODE.

Transistor MPIDD and resistor R3 form a nonlinear switch control circuit 34, which generates a voltage on VARNODE that non-linearly follows the voltage on VDD. Transistor MPIDD has a gate coupled to drain current test node IDDTNB, a drain coupled to VARNODE and a source coupled to VDD. Resistor R3 is coupled between VARNODE and VSS. Non-linear control circuit 34 is essentially a non-linear voltage divider.

Drain current test node IDDTNB is driven by an inverter 36, which is formed by transistors MPIDN and MNIN. Transistor MPIDN has a gate coupled to node IDDTN, a drain coupled to node IDDTNB and a source coupled to VDD. Transistor MNIN has a gate coupled to node IDDTN, a drain coupled to node IDDTNB and a source coupled to VSS. In one embodiment, node IDDTN is used to control drain current testing of the integrated circuit on which POR 10 is used. When the voltage on VDD is in the normal operating range, the IDDTN node can be forced low to turn off sources of DC current in power-on reset circuit 10, such as transistor MPIDD, and in other portions of the integrated circuit for IDDQ testing.

In the normal, non-test mode of operation, node IDDTN is held at a logic high level and is powered by VDD. Therefore, node IDDTN follows the voltage on VDD. Transistor MNIN is on and transistor MPIDN is off. This effectively connects the gate of transistor MEIDD to VSS. Thus, transistor MPIDD is normally on in the non-test mode. In an alternative embodiment, the gate of transistor MPIDD is connected directly to VSS. Various other bias circuits can also be used.

Resistors R1 and R2 and transistor MNREF form a linear switch control circuit 38, which biases REFNODE such that it linearly follows the voltage on VDD. Resistors R1 and R2 are coupled together in series between VDD and the drain of transistor MNREF. REFNODE is coupled to the node between resistors R1 and R2. In an alternative embodiment, REFNODE can be coupled to the node between resistor R2 and the drain of transistor MNREF. The gate of transistor MNREF is coupled to node IDDTN, and the source of transistor MNREF is coupled to VSS. Transistor MNREF is also used for IDDQ testing. When node IDDTN is biased low during the test mode, transistor MNREF turns off to de-couple the DC current path through resistors R1 and R2. Transistor MNREF can be eliminated in alternative embodiments of the present invention. During the normal, non-test mode, transistor MNREF is on. As the voltage on VDD varies, the voltage on REFNODE linearly follows the voltage on VDD and is slower to change with changes in VDD than the voltage on VARNODE.

The operation of discharge circuit 16 as power is first applied to the circuit is shown at the beginning of the waveform diagram illustrated in FIG. 2. FIG. 2 is a graph illustrating various waveforms generated by power-on reset circuit 10 over time as the voltage on VDD varies. Axis 100 represents time in milliseconds, and axis 102 represents voltage in millivolts. Waveform 104 represents the voltage on VDD. Waveform 106 represents the voltage on VARNODE. Waveform 108 represents the voltage REFNODE. Waveform 110 represents the voltage on RESETNODE.

Initially at start-up, the voltage on VDD is zero volts, and the voltage on node IDDTN is also at zero volts. Transistors MNREF and MPIDD are off. Resistor R3 pulls node VARNODE (waveform 106) low such that transistor MNCNTRL is off and transistor MPSWITCH is on. As the supply voltage on VDD (waveform 104) ramps up, the voltage on VARNODE (waveform 106) starts increasing at about 150 milliseconds as transistor MPIDD starts to turn on, but this voltage is still less than the gate-source threshold voltage of transistor MNCNTRL. The voltage on node REFNODE (waveform 108) follows the voltage on VDD linearly since transistor MNREF is initially off. Since transistor MPSWITCH is still on, the voltage on node RESETNODE (waveform 110) also follows VDD linearly with REFNODE.

Although reset transistor MNRESET is not on, leakage current through transistor MNRESET forces the potential at node START0 to remain close to the voltage on VSS, which is zero volts. This reinforces the initial state of the latch formed by inverters 20 and 22. In this state, the a reset signal generated on latch node START0 is active and can be used to reset various circuitry in the integrated circuit in which power-on reset circuit 10 is used.

As the voltage on VDD continues to rise, the voltage on node VARNODE (waveform 106) rises above the gate-source threshold voltage of transistor MNCNTRL at about 175 milliseconds in FIG. 2. Transistor MNCNTRL begins to conduct current and starts to discharge reset node RESETNODE (waveform 110) quickly to VSS. At the same time, transistor MNREF begins to conduct current as node IDDTN rises with VDD. The voltage on node REFNODE (waveform 108) starts following the voltage drop across resistor R2 and the drain of transistor MNREF. Due to the linear nature of the voltage divider formed by resistors R1 and R2 and the non-linear characteristic impedance of transistor MPIDD, the voltage on node REFNODE (waveform 108) rises much more slowly than the voltage on VARNODE (waveform 106).

When the voltage on VARNODE (waveform 106) exceeds the voltage on REFNODE (waveform 108) by at least one gate-source threshold voltage of transistor MPSWITCH, transistor MPSWITCH begins to turn off. The voltage on reset node continues to discharge through transistor MNCNTRL as the voltage on VDD (waveform 104) continues to rise. Transistor MNRESET is off and discharge circuit 16 no longer affects latch node START0. At this point, the reset signal generated on latch node START0 has reset various circuitry in the integrated circuit to known states.

Thereafter, high voltage trigger circuit 18 monitors the voltage on VDD (waveform 104) and switches the state of the latch in order to inactivate the reset signal when VDD reaches a predetermined high trigger voltage.

Referring back to FIG. 1, high voltage trigger circuit 18 includes P-channel transistors MPCHN1 and MPCHN2, and N-channel transistors MNCHN2, MNCHN3, MNCHN4, MNLEAK2 and MNPD. Transistors MPCHN1, and MNCHN2, MNCHN3 and MNCHN4 are connected in series with one another, between VDD and VSS. Transistors MNCHN2, MNCHN3, and MNCHN4 form a diode stack for measuring the voltage on VDD. Transistor MPCH1 is normally on, and is used to shut off the current flowing through the diode stack during leakage current testing (known as "IDDQ testing") when node IDDTN is biased low. In an alternative embodiment, transistor MPCHN1 is eliminated.

Transistor MPCHN1 has a gate coupled to node IDDTNB, a drain coupled to node NODE2 and a source coupled to VDD. Transistor MNCHN2 has a gate and drain coupled to node NODE2, and a source coupled to the gate and drain of transistor MNCHN3. Transistor MNCHN3 has a source coupled to the gate and drain of transistor MNCHN4. Transistor MNCHN4 has a source coupled to VSS. The node between transistors MNCHN2 and MNCHN3 is coupled to high voltage trigger node TRIGGER.

Trigger node TRIGGER is coupled to the gate of trigger transistor MNPD, which has a source coupled to VSS and a drain coupled to latch node START1. Each diode-connected transistor in the diode stack has a forward-bias gate-source threshold voltage VT. As the voltage on VDD (waveform 104 in FIG. 2) continues to rise and approaches the sum of the threshold voltages, VT, of transistors MNCHN2, MNCHN3 and MNCHN4, the voltage on trigger node TRIGGER (represented by waveform 112 in FIG. 2) rises and turns on transistor MNPD. In the example shown in FIG. 2, this high trigger voltage point occurs at about 275 milliseconds on axis 100. Transistor MNPD quickly discharges the voltage on node START1 to zero volts at VSS.

This causes the voltage on node START0 to rise quickly from VSS to VDD and the state of the latch to switch. Latch node START0 is coupled to reset output POR through buffer 14. Reset output POR is represented by waveform 114 in FIG. 2. As latch node START0 goes high, the POR signal (waveform 114) is inactivated to allow the integrated circuit on which power-on reset circuit 10 is used to function in the normal operating mode, having been previously reset by the POR signal.

Therefore, the sum of the threshold voltages of transistors MNCHN2, MNCHN3 and MNCHN4 determine the high trigger voltage at which VDD must reach before inactivating the POR signal. Any number of transistors can be used in the diode stack. The sizes of transistor of MPINV2, MNPD, the diode-connected transistors MNCHN2, MNCHN3, MNCHN4 and transistor MPCHN2 can also be varied to determine the high trigger voltage for the POR signal. In addition, other voltage bias circuits and reference voltage generators can be used in alternative embodiments of the present invention to set the voltage at which VDD must reach before turning on transistor MNPD.

Transistor MPCHN2 is coupled in parallel with transistor MNCHN2 to improve the stability of the high trigger voltage with variations in process and temperature. For example, the effects on the voltage on trigger node TRIGGER of strong N-channel transistors and weak P-channel transistors or weak P-channel transistors and strong N-channel transistors would tend to cancel one another out. Leakage transistor MNLEAK2 is coupled to trigger node TRIGGER to provide a strong leakage path, which ensures that the voltage on TRIGGER remains at zero volts at the beginning of start-up. Transistor MNLEAK2 has a gate and source coupled to VSS and a drain coupled to trigger node TRIGGER.

Referring back to FIG. 2, the voltage levels on the various nodes in circuit 10 would remain at a steady state after 300 milliseconds until the voltage on VDD (waveform 104) subsequently drops due to a power-down operation, a power-savings mode or some system power glitch affecting VDD. Such an event occurs at about 400 milliseconds in the example shown in FIG. 2.

As mentioned above, discharge circuit 16 also helps to discharge latch node START0 as the voltage on VDD falls, such that the POR signal can be re-activated. When the voltage on VDD (waveform 104) ramps down, the voltages on nodes REFNODE (waveform 108) and VARNODE (waveform 106) also fall. Test node IDDTN falls with VDD, turning transistor MPIDN on and transistor MNIN off. Transistor MPIDD also turns off causing the voltage on VARNODE (waveform 106) to fall quickly toward VSS. However, the voltage on REFNODE (waveform 108) falls off linearly, acting as a voltage divider between resistors R1 and R2 until transistor MNREF starts turning off. The voltage on node REFNODE then follows the voltage on VDD.

When VARNODE (waveform 106) falls below the threshold voltage of transistor MNCNTRL, transistor MNCNTRL turns off and no longer provides a strong discharge path for node RESETNODE (waveform 110). Once the difference between VARNODE and REFNODE exceeds the threshold voltage of MPSWITCH, at about 540 milliseconds in FIG. 2, transistor MPSWITCH begins to conduct current, sending a burst of charge to node RESETNODE (waveform 110) and the gate of transistor MNRESET. Transistor MNRESET turns on, pulling latch node START0 and the POR signal (waveform 114) back to VSS quickly and resetting the latch to its initial state. In this embodiment, the low trigger voltage 118 at which VDD must fall before MNRESET turns on is determined by the sizes of resistors R1, R2 and R3 and transistors MPIDD and MNREF.

N-channel transistor MNCAP provides noise rejection for discharge circuit 16. Transistor MNCAP has a gate coupled to node RESETNODE and a source and drain couple to VSS. This transistor prevents power supply fluctuations having very fine pulse widths from triggering the power-on reset circuit.

Numerous modifications can be made to the power-on reset circuit shown in FIG. 1. For example, the initial state of latch circuit 12 can be inverted such that START1 is initially low and START0 is initially high. In this embodiment, discharge circuit 16 can be coupled to latch node START1 and high voltage trigger circuit 18 can be coupled to latch node START0. Also, if one of the discharge circuit 16 and the high voltage trigger circuit 18 were inverted relative to the other, both of these circuits could be coupled to the same side of the latch. However, further modifications may be necessary to ensure that the two circuits do not interfere with one another. Other circuit and signal inversions can also be made.

Although the present invention has been described with reference to preferred embodiments, workers skilled in the art will recognize that changes may be made in form and detail without departing from the spirit and scope of the invention. For example, the terms "coupled" and "connected" can include a direct connection or a connection through one or more intermediate components. The terms "power" and "ground" are arbitrary terms, which are interchangeable. Also, the present invention can be used in a variety of semiconductor technologies, including CMOS.

What is claimed is:

1. A power-on reset circuit comprising:
   a ground input;
   a power input having a voltage relative to the ground input;
   a reset output;
   a self-initializing latch having first and second latch nodes which are initialized to logic high and low states, respectively, upon initial application of power to the power input, wherein one of the first and second latch nodes is coupled to the reset output;
   a high voltage trigger circuit coupled to the first latch node and reversing the states of the first and second latch nodes when the voltage rises above a high trigger voltage; and
   a discharge circuit coupled to the second latch node and comprising a switch circuit, which selectively couples the second latch node to the ground input when the voltage falls below a low trigger voltage and is controlled by first and second switch control nodes that follow the voltage and wherein the first switch control node has a greater rate of change than the second switch control node.

2. The power-on reset circuit of claim 1 wherein the first switch control node follows the voltage non-linearly and the second switch control node follows the voltage linearly.

3. The power-on reset circuit of claim 1 wherein the switch circuit comprises:
   a reset transistor coupled between the second latch node and the ground input and having a reset control input;
   a switch control inverter having an output coupled to the reset input and an input coupled to the first switch control input, wherein the switch control inverter is biased between the second switch control input and the ground input.

4. The power-on reset circuit of claim 3 wherein the switch control inverter comprises:
   a p-channel transistor having a source coupled to the second switch control input, a gate coupled to the first switch control input and a drain coupled to the reset control input; and
   an n-channel transistor having a source coupled to the ground input, a gate coupled to the first switch control input and a drain coupled to the reset control input.

5. The power-on reset circuit of claim 3 and further comprising a linear voltage bias circuit, which comprises a first resistor coupled between the second switch control input and the power input.

6. The power-on reset circuit of claim 5 wherein the linear voltage bias circuit further comprises a second resistor coupled in series between the first resistor and the ground input.

7. The power-on reset circuit of claim 6 wherein the linear voltage bias circuit further comprises a drain current test transistor coupled in series between the second resistor and the ground input and having a control input coupled to a drain current test control node.

8. The power-on reset circuit of claim 3 and further comprising a non-linear voltage bias circuit, which comprises:
   a p-channel pull-up transistor coupled between the power input and the first switch control node and having a control input coupled to the ground input; and
   a resistor coupled in series between the p-channel transistor and the ground input.

9. The power-on reset circuit of claim 8 wherein the non-linear voltage bias circuit further comprises:
   a drain test control inverter coupled between the control input of the p-channel pull-up transistor and a drain current test control node, wherein the control input of the p-channel pull-up transistor is coupled to the ground input through a pull-down transistor within the drain test control inverter and wherein drain current test control node is in the logic high state in a normal, non-test mode.

10. The power-on reset circuit of claim 1 wherein the switch circuit further comprises:
    a capacitor coupled between the reset control input and the ground input.

11. The power-on reset circuit of claim 1 wherein the self-initializing latch comprises:
    a first inverter having an input coupled to the first latch node and an output coupled to the second latch node;
    a second inverter having an input coupled to the second latch node and an output coupled to the first latch node;
    a third inverter having an input coupled to the first latch node and having an output, wherein the first inverter is biased between the output of the third inverter and the ground input; and
    a fourth inverter having an input coupled to the second latch node and having an output, wherein the second inverter is biased between the power input and the output of the fourth inverter.

12. The power-on reset circuit of claim 1 wherein the self-initializing latch comprises:
    a pull-up leakage transistor coupled between the first latch node and the power input; and
    a pull-down leakage transistor coupled between the second latch node and the ground input.

13. The power-on reset circuit of claim 1 wherein the high voltage trigger. circuit comprises:
    a trigger transistor coupled between the first latch node and the ground input and having a trigger control input; and
    a diode stack comprising at least one diode coupled in series between the power input and the ground input and an output node coupled to the trigger control input.

14. The power-on reset circuit of claim 13 wherein the diode stack comprises:
    at least one diode-connected transistor coupled in series between the output node of the diode stack and the ground input;
    a diode-connected n-channel transistor coupled in series between the power input and the output node of the diode stack; and
    a diode-connected p-channel transistor coupled in parallel with the diode-connected n-channel transistor, in series between the power output and the output node of the diode stack.

15. The power-on reset circuit of claim 13 wherein the high voltage trigger circuit further comprises:.
    a drain current test transistor coupled in series between the power input and the diode stack and having a control input coupled to a drain current test control input.

16. The power-on reset circuit of claim 13 wherein the high voltage trigger circuit further comprises:
    a pull-down leakage transistor coupled between the trigger control node and the ground input.

17. The power-on reset circuit of claim 1 and further comprising:
    a buffer coupled between the latch and the reset output.

18. A power-on reset circuit comprising:
    a ground input;
    a power input having a voltage relative to the ground input;
    a reset output;
    a self-initializing latch having first and second latch nodes which are initialized to logic high and low states, respectively, upon initial application of power to the power input, wherein one of the first and second latch nodes is coupled to the reset output;
    high voltage trigger means coupled to the first latch node for reversing the states of the first and second latch nodes when the voltage rises above a high trigger voltage; and
    discharge means coupled to the second latch node for selectively coupling the second latch node to the ground input when the voltage falls below a low trigger voltage as a function of first and second switch control nodes that follow the voltage, wherein the first switch control node has a greater rate of change than the second switch control node.

* * * * *